United States Patent
Williams

(10) Patent No.: US 10,576,696 B2
(45) Date of Patent: Mar. 3, 2020

(54) COMPOSITE COMPONENT FORMING METHOD

(71) Applicant: ROLLS-ROYCE plc, London (GB)

(72) Inventor: Paul Williams, Leicester (GB)

(73) Assignee: ROLLS-ROYCE plc, London (GB)

( * ) Notice: Subject to any disclaimer, the term of this patent is extended or adjusted under 35 U.S.C. 154(b) by 294 days.

(21) Appl. No.: 15/363,996

(22) Filed: Nov. 29, 2016

(65) Prior Publication Data

US 2017/0173895 A1    Jun. 22, 2017

(30) Foreign Application Priority Data

Dec. 18, 2015 (GB) .................................... 1522393.6
Mar. 3, 2016 (GB) .................................... 1603713.7

(51) Int. Cl.
*B29C 70/30*    (2006.01)
*B29C 35/02*    (2006.01)
(Continued)

(52) U.S. Cl.
CPC .......... *B29C 70/30* (2013.01); *B29C 35/0272* (2013.01); *B29C 70/081* (2013.01); *B29C 70/14* (2013.01); *B29C 73/10* (2013.01); *C23C 16/44* (2013.01); *B29C 2035/0211* (2013.01); *B29C 2035/0811* (2013.01); *B29L 2031/731* (2013.01)

(58) Field of Classification Search
CPC ....................... B29C 70/081; B29C 2035/0211
See application file for complete search history.

(56) References Cited

U.S. PATENT DOCUMENTS 5,591,291 A    1/1997    Blackmore
7,052,567 B1    5/2006    Blackmore et al.
(Continued)

FOREIGN PATENT DOCUMENTS

EP    2 990 188 A2    3/2016
WO    96/05386 A1    2/1996
(Continued)

OTHER PUBLICATIONS

Haslam et al., "Aligning carbon nanotubes using bulk acoustic waves to reinforce polymer composites," Composites: Part B, 2014, vol. 60, pp. 91-97.
(Continued)

*Primary Examiner* — Scott W Dodds
(74) *Attorney, Agent, or Firm* — Oliff PLC

(57) ABSTRACT

A method of forming a fibre composite component (10), the method comprising: providing a plurality of first fibres (102), the first fibres (102) being arranged in a plurality of layers (104*a-e*) with an uncured thermoset resin matrix (106) being provided therebetween. The resin matrix (106) comprises a plurality of second electrically conductive fibres (108) suspended therein having a shorter length than the first fibres (102). The method comprises then applying an energy field to the resin matrix (106) to thereby align the second fibres (108) such that they provide an electrically conductive path between adjacent layers (104*a-e*) of first fibres (102) to form an electrically conductive fibre network comprising the first and second fibres (102, 108). The method comprises then inducing an electric current through the electrically conductive fibre network to thereby heat and cure the resin matrix (106).

12 Claims, 2 Drawing Sheets

(51) Int. Cl.
| | |
|---|---|
| B29C 73/10 | (2006.01) |
| B29C 70/08 | (2006.01) |
| B29C 70/14 | (2006.01) |
| C23C 16/44 | (2006.01) |
| B29C 35/08 | (2006.01) |
| B29L 31/00 | (2006.01) |

(56) References Cited

U.S. PATENT DOCUMENTS

| | | | |
|---|---|---|---|
| 7,744,844 | B2 | 6/2010 | Barrera et al. |
| 2004/0188890 | A1 | 9/2004 | Sheridan et al. |
| 2005/0029009 | A1 | 2/2005 | Swift et al. |
| 2005/0239948 | A1 | 10/2005 | Haik et al. |
| 2006/0078705 | A1 | 4/2006 | Glatkowski et al. |
| 2007/0205792 | A1* | 9/2007 | Mouli ............... H01L 23/367 324/750.09 |
| 2008/0020193 | A1 | 1/2008 | Jang et al. |
| 2009/0117269 | A1 | 5/2009 | Hansen et al. |
| 2013/0087278 | A1* | 4/2013 | Chang ............... B32B 37/06 156/275.5 |
| 2013/0101406 | A1* | 4/2013 | Kweder ............... B29C 70/46 415/200 |
| 2015/0044383 | A1* | 2/2015 | Kim ............... C09K 5/14 427/427.4 |
| 2016/0055930 | A1* | 2/2016 | Humfeld ............... B32B 5/024 252/503 |

FOREIGN PATENT DOCUMENTS

| | | |
|---|---|---|
| WO | 2011/120643 A2 | 10/2011 |
| WO | 2014/146691 A1 | 9/2014 |

OTHER PUBLICATIONS

Wang, Ming-Wen, "Alignment of MWCNTS in Polymer Composites by Dielectrophoresis," Proceedings of MNHT2008 Micro/Nanoscale Heat Transfer International Conference, Jan. 2008, 5 pages.

Prassse et al., "Electric anisotropy of carbon nanofibre/epoxy resin composites due to electric field induced alignment," Composites Science and Technology, 2003, vol. 63, pp. 1835-1841.

Martin et al., "Electric field-induced aligned multi-wall carbon nanotube networks in epoxy composites," Polymer, 2005, vol. 46, pp. 877-886.

Kimura et al., "Polymer Composites of Carbon Nanotubes Aligned by a Magnetic Field," Advanced Materials, 2002, vol. 14, No. 19, pp. 1380-1383.

Choi et al., "Enhancement of thermal and electrical properties of carbon nanotube polymer composites by magnetic field processing," Journal of Applied Physics, 2003, vol. 94, No. 9, pp. 6034-6039.

Park et al., "Aligned Single-Wall Carbon Nanotube Polymer Composites Using an Electric Field," Journal of Polymer Science Part B: Polymer Physics, 2006, vol. 44, pp. 1751-1762.

Brown et al., "Magnetic Control over Liquid Surface Properties with Responsive Surfactants," Angewandte Communications International Edition, 2012, vol. 51, pp. 2414-2416.

Erb et al., "Composites Reinforced in Three Dimensions by Using Low Magnetic Fields," Science, 2012, vol. 335, pp. 199-204.

Mas et al., "Thermoset curing through Joule heating of nanocarbons for composite manufacture, repair and soldering," Carbon, 2013, vol. 63, pp. 523-529.

Kim et al., "A study on the induction heating of carbon fiber reinforced thermoplastic composites," Advanced Composite Materials, 2002, vol. 11, No. 1, pp. 71-80.

Bayerl et al., "The heating of polymer composites by electromagnetic induction—A review," Composites: Part A, 2014, vol. 57, pp. 27-40.

El-Tantawy et al., "A Novel Way of Enhancing the Electrical and Thermal Stability of Conductive Epoxy Resin-Carbon Black Composites via the Joule Heating Effect for Heating-Element Applications," Journal of Applied Polymer Science, 2003, vol. 87, pp. 97-109.

Fink et al., "A Local Theory of Heating in Cross-Ply Carbon Fiber Thermoplastic Composites by Magnetic Induction," Polymer Engineering and Science, 1992, vol. 32, No. 5, pp. 357-369.

Abliz et al., "Curing Methods for Advanced Polymer Composites—A Review," Polymers & Polymer Composites, 2013, vol. 21, No. 6, pp. 341-348.

Yarlagadda et al., "A Study on the Induction Heating of Conductive Fiber Reinforced Composites," Journal of Composite Materials, 2002, vol. 36, No. 04, pp. 401-421.

Fink et al., "Non-Polluting Composites Repair and Remanufacturing for Military Applications: Induction-Based Repair of Integral Armor," Army Research Laboratory, 1999, pp. 1-42.

Scholz et al., "Ultrasonic assembly of anisotropic short fibre reinforced composites," Ultrasonics, 2013, [http://dx.doi.org/10.1016/j.ultras.2013.12.001].

May 23, 2016 Search Report issued in British Patent Application No. 1522393.6.

Aug. 3, 2016 Search Report issued in British Patent Application No. 1603713.7.

"The Repair Patch," NetComposites, [http://netcomposites.com/guide-tools/guide/repair/the-repair-patch/].

Olivia-Aviles et al., "Dynamics of carbon nanotube alignment by electric fields," Nanotechnology, 2012, vol. 23, pp. 1-10.

May 19, 2017 Search Report issued in European Patent Application No. 16 19 9749.

* cited by examiner

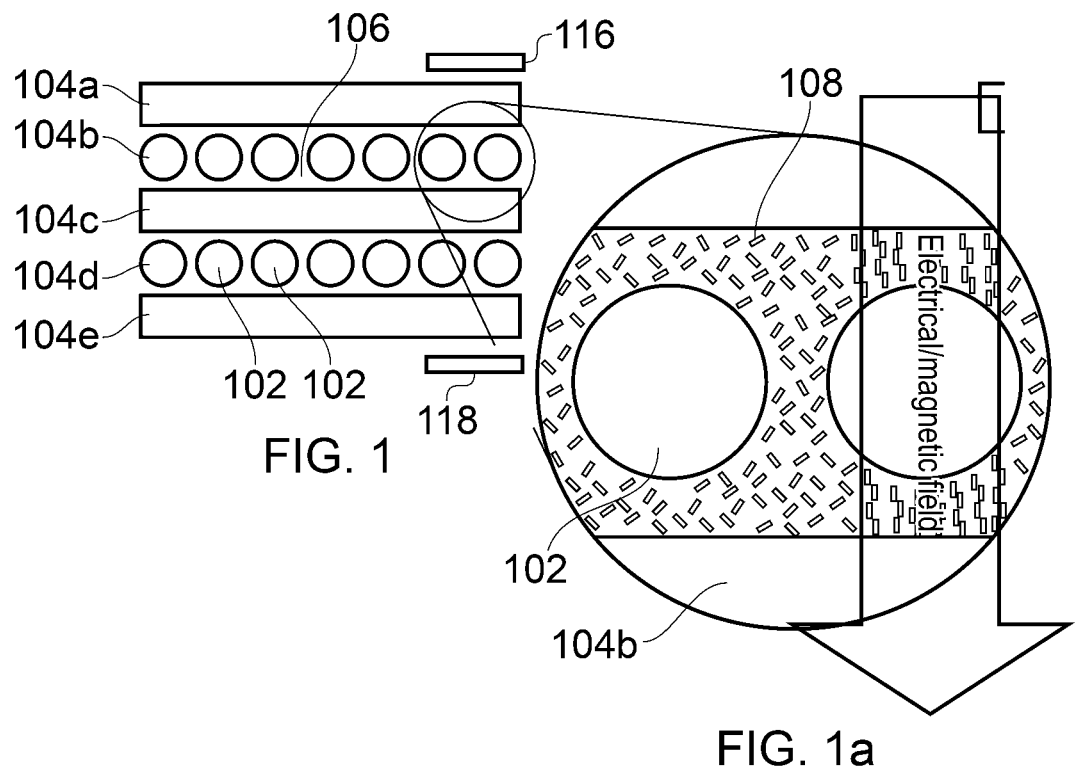
FIG. 1
FIG. 1a
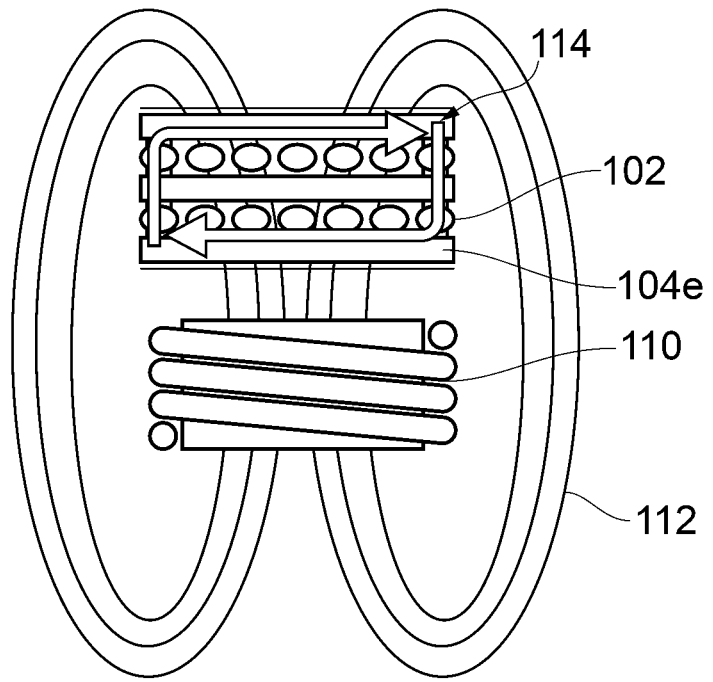
FIG. 2

COMPOSITE COMPONENT FORMING METHOD

The present disclosure concerns a method of forming a composite component, and a composite component formed by such a method.

Organic Matrix Composite (OMC) materials such as Carbon Fibre Reinforced Plastic (CFRP) have been widely used in numerous engineering fields including aerospace, marine, automotive, transport and sports equipment. Epoxy resins are one of the most widely used thermoset polymers for fibre-reinforced composites in structural applications. However, long-term durability and reliability of polymeric materials are still problematic. This is particularly true where impact resistance, for example, is concerned. Furthermore, exposure to harsh environments can lead to degradation, mechanical stress, internal delamination, or disbonds during manufacture or in-service, which can generate defects which can be difficult to detect, which can in turn lead to in-service failure. In view of the relatively high costs of such components, it is desirable to repair damage such as cracks, delamination, disbonds, dents etc. Original manufacture of OMC components is also expensive, since this normally requires transferring the entire component (which may be very large) into an autoclave in order to apply heat and pressure during curing of the thermoset resin. Consequently, OMC component manufacture and repair involves high capital expenditure and running costs.

Known prior OMC repair methods typically comprise applying a patch of material which is joined to the existing component by, for example, bolting the patch to the component. However, such repair techniques result in a repair that does not have the structural strength of the original component, nor the aerodynamic attributes of the original component. The thicker, bolted patch results in inferior aerodynamic performance and also locally increases the stiffness of the patch. This redistributes stresses to the edge of the patch. Consequently, under deflection, this raises undesirable stresses at the boundary. Alternatively, it is possible to remove the damaged plies and re-introduce new composite plies with a scarf repair which minimises the aerodynamic losses at the expense typically of a 60 to 80% reduction in strength. This is favourable from a stiffness, aerodynamic and stress at the boundary perspective. The document http://www.netcomposites.com/guide-tools/guide/repair/the-repair-patch/ discusses known prior repair methods. These flush patch repair methods may comprise applying uncured resin and fibres to the component, and subsequently curing the resin. Conventional curing techniques include transferring the whole component to an autoclave, or using inductive or resistive heat mats to locally heat the component. However, such curing methods tend to heat cured areas adjacent the patch, which leads to potential thermal damage to the already cured areas. "On-platform repair", where the components are not removed from the product prior to conducting a repair, is desirable as it can significantly reduce the time that the product is not available for service in avoiding disassembly, transport and reassembly. Autoclave and microwave curing in these scenarios are technically inappropriate and thermal curing by heater mat represents the current state of art. Curing on-platform repair with heater mats however leads to greater problems with adjacent cured areas and ancillaries. Heater mats must compromise cure quality by either heating to a greater surface temperature to overcome the thermal losses through the repair to ensure the central region reaches the optimal cure temperature, or by sacrificing a lower core temperature in order to achieve an optimal surface cure temperature. On-platform heater mats can also be a fire risk when curing high temperature composites on products which are carrying fuels and oils. These methods consequently fail to provide a homogenous temperature throughout the depth of the patch, either limiting the practical depth of the patch, or leading to inconsistent curing. Furthermore, both autoclave and out of autoclave (heater mat) curing processes tend to be slow whilst microwave curing is not very portable nor does it lend itself to on-platform curing from a shielding perspective.

Consequently, the present invention provides a method of repairing a composite component which seeks to overcome some or all of the above problems.

According to a first aspect of the present invention, there is provided a method of forming a fibre composite component, the method comprising:

providing a plurality of first fibres, the first fibres being arranged in a plurality of layers with an uncured heat curable resin matrix being provided therebetween, the resin matrix comprising a plurality of second electrically conductive fibres suspended therein, the second fibres having a shorter length than the first fibres;

applying an energy field to the resin matrix to thereby align the second fibres such that they provide an electrically conductive path between adjacent layers of first fibres to form an electrically conductive fibre network; and applying an electric current through the electrically conductive fibre network to thereby heat and cure the resin matrix.

Advantageously, the application of an energy field aligns the second fibres to thereby create an electrically conductive path between the layers of first fibres, which thereby increases the effectiveness of the electrical heating process by promoting current flow to ends of the first fibres throughout the region of the uncured resin. Consequently, the resin is heated evenly and rapidly throughout the bulk of the material, without excessively heating adjacent areas and without elevating any surface temperature above the required cure temperature, thus minimising the risk of fire in on-platform scenarios where fuels or oils are present.

Furthermore, it is possible using this method, to align only selected regions of second fibres. This local alignment promotes local regions of high electrical and thermal conductivity compared to those regions with unaligned second fibres. This can be used to promote current flow along first fibres to the aligned second fibres and back through first fibres. This in turn can be used to promote electrical current flow through an uncured repair region up to the interface with an adjacent structure, where the secondary fibres have been aligned. This advantageously promotes uniform curing and good cure quality without un-necessarily heating adjacent structures.

The plurality of layers of first fibres and the resin matrix may be provided as a patch, and the method may comprise applying the patch to a further component to be repaired prior to applying the fibre alignment and electrical heating steps.

The second fibres may comprise one or more of Carbon Nano Tubes (CNT) which may be single or multi-walled, graphene ribbons, carbon discs, platelets or rods, and metallic fibres or flakes.

The method may comprise functionalising the second fibres to increase the susceptibility of the fibre to alignment in the presence of a magnetic field. Such functionalization may include metallising with a ferrous coating such as Ni or COOH functionalization. The method may comprise functionalising the second fibres by coating or adsorbing magnetic particles onto a surface of the second fibres as described in US20050239948, incorporated herein by reference. The functionalising may be performed by chemical vapour deposition.

The second fibres may comprise a length of between 1 nm and 100 μm, a diameter of between 1 nm and 200 nm, and may comprise an aspect ratio of up to 100,000. The first fibres may comprise carbon and may be electrically conductive. Alternatively, the first fibres may comprise an electrically non-conductive material. In this case, the second fibres alone provide the electrical conduction path through the material to be cured, and their alignment is longitudinal, in-line with the electrical current flow which will be directly applied via electrodes.

The fibre alignment energy field may comprise one or more of an AC magnetic field, a DC magnetic field, a DC electric field, and an acoustic wave.

The current in the electrically conductive fibre network may be applied by one or both of eddy currents induced from an external AC or DC magnetic field and direct current applied directly to the matrix via conducting electrodes.

The heat curable resin may comprise a thermoset epoxy such as one or more of Hexcel™ M56, M91, M21, 8552, Prime 20LV and EPON 828 or may comprise thermosplastic resin such as one or more of polyetherketoneketone, polyetherimide, polyphenylene sulphide, polyetheretherketone, polyimide or polyamideimide.

According to a second aspect of the present invention there is provided a fibre composite component formed in accordance with the first aspect of the present invention.

According to a third aspect of the present invention, there is provided a fibre composite material comprising:
a plurality of first fibres, the first fibres being arranged in a plurality of layers defining a first orientation;
a resin matrix provided between the first fibre layers, the resin matrix comprising a plurality of second electrically conductive fibres suspended therein, the second fibres having a shorter length than the first fibres;
wherein the second fibres are aligned in a second orientation generally normal to the first orientation.

The skilled person will appreciate that except where mutually exclusive, a feature described in relation to any one of the above aspects may be applied mutatis mutandis to any other aspect. Furthermore except where mutually exclusive any feature described herein may be applied to any aspect and/or combined with any other feature described herein.

Embodiments will now be described by way of example only, with reference to the Figures, in which:

FIG. 1A is a sectional side view illustrating a first step of forming a composite material;

FIG. 1B is a close-up view of the area of the circled area of FIG. 1;

FIG. 2 is a sectional side view illustrating a second step of forming a composite material;

Figure 3:
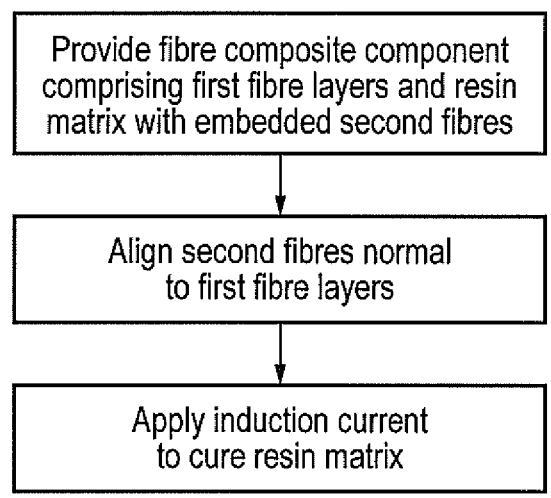
FIG. 3 is a process flow diagram illustrating a composite material forming process.
Figure 4:
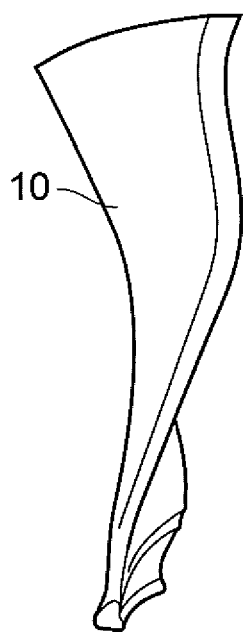
FIG. 4 is a perspective view of a component formed in accordance with the process illustrated in FIGS. 1 to 3.

With reference to FIG. 4, a fan blade 10 of a gas turbine engine (not shown) is illustrated. The fan blade 10 is an example only of a fibre composite component formable in accordance with the described method. The following method may comprise a repair process carried out within the gas turbine engine, or on a removed component. Alternatively, the below method may be used to form the original component.

Referring now to FIGS. 1A and 1B, a first step in a first composite forming method for forming a fibre composite article such as the fan blade 10 is illustrated. The first step comprises providing composite material comprising a plurality of structural first fibres 102 arranged in a plurality of spaced layers/sheets 104a-e, and a matrix material 106. In general, the layers are arranged such that the fibres 102 within adjacent layers 104a-e are oriented 90° to one another, though other arrangements are possible. The first fibres 102 in each layer 104a-e may also have multiple orientations. However, each layer 104a-e defines a plane, with the planes of adjacent layers being generally parallel to one another. The first fibres 102 may comprise carbon (i.e. graphite) fibres, or other fibres such as glass fibres, ceramic fibres etc. In general, the first fibres 102 within each layer 104a-e are unidirectional, woven ply, knitted or twisted together such that they orientations are relatively fixed relative to each other. The first fibres generally have a diameter in the range 0.5 μm to 25 μm, and a length generally between 1.5 mm and 50 m.

The first fibres layers 104a-e are generally separated by the matrix 106, though some fibres may penetrate adjacent layers. The matrix 106 comprises an uncured heat curable liquid or gel epoxy resin such as a thermoset resin comprising any of Hexcel™ M56, M91, M21, 8552, Prime 20LV or EPON 828, which also penetrates the layers 104a-e themselves. The matrix 106 could be provided within the layers as a "pre-preg", or the layers could be provided as dry sheets, with the matrix being injected into the layers subsequently. The matrix 106 is impregnated with a plurality of second electrically conductive fibres 108 comprising, for example, any of Carbon Nanotubes (CNTs), graphene ribbons, carbon discs, platelets, rods, metallic fibres or flakes. The second fibres 108 have shorter lengths than the first fibres 102 and have a relatively high aspect ratio. Typically, the second fibres have a length of between 1 nanometres (nm) and 100 nm where the second fibres comprise CNTs, and up to 1500 nm in the case of carbon platelets, a diameter of between 1 nm and 200 nm, and typically comprises an aspect ratio of between 1 and 25,000. It has been found that second fibres 108 having relatively low aspect ratios (approximately 10) require relatively low magnetic fields in order to be aligned, and so second fibres 108 having aspect ratios of approximately 10 are desirable. The second fibres 108 are suspended within the matrix 106 such that they are free to rotate normal to their long axis, such that the long axis of each of the second fibres 108 is able to reorient, as will be described in further detail below. Generally therefore, the second fibres are present both within the first fibre layers 1041-e, and within the matrix 106 in between the layers. The matrix 106 may comprise approximately 1% by volume second fibres 108.

Optionally, the second fibres 108 may further comprise a ferrous coating such as Ni or COOH or magnetic particles, which may be applied by chemical vapour deposition for instance, or other suitable methods. This "functionalising" coating increases the magnetic susceptibility of the second fibres 108, thereby reducing the electromagnetic field required to reorient the fibres 108. It is expected that functionalising the second fibres 108 can reduce the field strength required to align the second fibres 108 by a factor as much as 5. Consequently, where low aspect ratio functionalised fibres are used, magnetic fields of around 0.1 T can be used.

In a second step, the second fibres 108 are aligned such that their long axis is oriented normal to the planes of adjacent layers, as shown in FIG. 1a. This re-orientation is achieved by applying an energy field locally to the second fibres 108. In one example, the energy field comprises a magnetic field provided by an electro-magnet (not shown), which provides a magnetisation of at least approximately 1 Tesla in the case of non-functionalised fibres, and at least approximately 0.7 Tesla in the case of fibres functionalised with a Ni coating.

Experiments have been carried out which show that, where the second fibres 108 have aspect ratios of approximately 10, more than 90% of second fibres can be aligned within 20° of the local magnetic field orientation in a field having a magnitude of as low as 0.5 T. Alternatively or additionally, the energy field could comprise a DC electrical field generated by a pair of oppositely charged electrodes 116, 118 applied to opposite surfaces of the component. The electric field locally applies a turning force to thereby orient the second fibres such that their long axes align with the electric field, in a direction normal to the planes of the first fibre layers 104a-e, across the gap between the layers. In a still further alternative, the second fibres 108 may be aligned by an energy field comprising an acoustic wave such as a bulk ultrasonic wave.

Suitable methods for aligning the second fibres using ultrasonic waves are described in the following references, incorporated herein by reference:
"Aligning carbon nanotubes using bulk acoustic waves to reinforce polymer composites", Michael D Haslam, Bart Raeymaekers, Composites: Part B 60 (2014) 91-97, Suitable methods for aligning the second fibres using electromagnetic waves are described in the following references, incorporated herein by reference:
Ming-Wen Wang, ASME 2008 First International Conference on Micro/Nanoscale Heat Transfer, Parts A and B, 2008, 1185-1189.
Prasse T, Cavaillé J-Y, Bauhofer W, Composite Science and Technology, 63 (2003), 1835-1841.
Martin C A, Sandler J K W, Windle A H, Schwarz M K, Bauhofer W, Schulte K, Shaffer M S P, Polymer, 46 (2005), 877-886.
Kimura T, Ago H, Tobita M, Ohshima S, Kyotani M, Yumura M, Advanced Materials, 14 (19), 2002, 1380-1383.
[8] Choi E S, Brooks J S, Eaton D L, Al-Haik M S, Hussaini M Y, Garmestani H, Li D, Dahmen K, Journal of Applied Physics, 94(9), 2003, 6034-6039.

Suitable methods for aligning the second fibres using an electrical field are described in the following references, incorporated herein by reference:
Park C, Wilkinson J, Banda S, Ounaies Z, Wise K E, Sauti G, Lillehei P T, Harrison J S, Journal of Polymer Science: part B, Polymer physics, 44(12), 2006, 1751-1762.
Martin C A, Sandler J K W, Windle A H, Schwarz M K, Bauhofer W, Schulte K, Shaffer M S P, Polymer, 46 (2005), 877-886.

Suitable methods for functionalising the second fibres are described in the following reference, incorporated herein by reference:
Brown P, Bushmelev A, Butts C P, Cheng J, Eastoe J, Grillo I, Heenan R K, Schmidt A M, Angewandte Communications, 14 (19), 2012, 2414-2416.

Suitable methods for aligning second fibres comprising rods or platelets using an electrical field are described in the following reference, incorporated herein by reference:
Erb R M, Libanori R, Rothfuchs N, Studart A R, Science, 335(13), 2012, 199-204.

Suitable methods for applying an electric current in the electrical network using induction heating are described in the following references, incorporated herein by reference:
Mas B et al., Carbon, 63 (2013), 523-529.
Kim H, Yarlagadda S, Gillespie Jr J W, Shevchenko N B, Fink B K, Advanced Composite Materials, 11(1), 2002, 71-80.
Bayerl T and others, Composites Part A: Applied Science and Manufacturing, 57 (2014), 27-40.
El-Tantawy F, Kamada K, Ohnabe H, Journal of Applied Polymer Science, 87 (2003), 97-109.
Fink B K, McCullough R L, Gillespie J W, Polymer Engineering & Science, 32 (2004), 357-369.
Abliz D, Duan Y, Steuernagel L, Xie L, Li D, Ziegmann G, Polymers & Polymer Composites, 21(6), 2013, 341-348.
Yarlagadda S, Kim H J, Gillespie J W, Shevchenko N B, Fink B K, Journal of Composite Materials, 36(4), 2002, 401-421

Suitable methods for applying an electric current in the electrical network direct resistance heating are described in the following references, incorporated herein by reference:
Kim H, Yarlagadda S, Gillespie Jr J W, Shevchenko N B, Fink B K, Advanced Composite Materials, 11(1), 2002, 71-80.
Bayerl T and others, Composites Part A: Applied Science and Manufacturing, 57 (2014), 27-40.
Yarlagadda S, Kim H J, Gillespie J W, Shevchenko N B, Fink B K, Journal of Composite Materials, 36(4), 2002, 401-421
Mas B et al., Carbon, 63 (2013), 523-529. (reference illustrating benefit of thermal homogeneity from inductive heating versus oven/autoclave)

The energy field may be concentrated locally, such that only second fibres 108 located adjacent a small region of first fibres 102 are re-oriented, as shown in FIG. 1a. It will be understood that the strength of the energy field will be dependent on the types and dimensions of the second fibres 108 used, and the viscosity of the matrix 106, and needs to be strong enough to overcome the viscous drag of the resin 106, to thereby realign the second fibres 108 to a direction generally normal to the planes of the first fibre layers 104a-e. Optionally, the matrix 106 may be subject to vibration during or prior to the application of the energy field, to thereby prevent sedimentation and agglomeration of the second fibres 108 within the matrix 106, which would assist in aligning the fibres 108. This vibration could be applied mechanically, by physically vibrating the patch, or could be applied ultrasonically.

It has been found that, once the second fibres 108 within the matrix 106 are aligned normal to the planes of the sheets 104a-e of first fibres 102, the resistivity of the composite material in the direction normal to the planes of the sheets 104a-e reduces substantially.

In a third step, an electric current is applied to the matrix 106, first fibres 102 and second fibres 108, to thereby heat and cure the resin. FIG. 2 illustrates an induction coil 110 through which an AC current is passed, which generates an alternating magnetic field 112. This magnetic field in turn induces an alternating electrical field within the component 10. In particular, an electrical circuit is defined by a current path 114 extending through two or more layers 104a-e of the first fibres 102, the matrix 106, and the aligned second fibres 108. This alternating current flow generates heat through Joule heating. As will be understood, the heat will be generated locally to the current path, thereby affecting only a part of the composite component. The temperature is carefully controlled such that the heat curable resin matrix 106 exceeds its cure temperature, which is maintained for the necessary duration for the resin to fully cure. During this process, the energy field used in the second step to align the second fibres 108 may be maintained, or this may be switched off, since the second fibres are likely to maintain their orientation in view of the viscosity of the resin (which will further increase during the curing process). In experiments, induction coils having a coil current of approximately 100 Amps and an AC frequency of approximately 180 kHz have been found to be effective for functionalised second fibres 108. Where the second fibres 108 are not functionalised, higher currents and/or AC frequencies may be required due to the higher resistivity of such fibres.

Alternatively, the electric current could be induced by applying a DC current directly to one of the layers 104*a-e* of first fibres 102, via electrodes (not shown), thereby again producing resistive heating. Alternatively, where the first fibres are non-conductive, the electric current could be applied to the matrix 106, which would be conducted through the aligned second fibres 108 between electrodes provided on opposite sides of the component.

As will be understood, by providing an electrically conductive fibre network which extends through at least the matrix 106, the matrix itself is directly heated by the induction heating process, rather than relying on heat being transmitted into the matrix 106 from an external source. Furthermore, the current path 114 defined by the aligned second fibres 108 extends over a relatively large area. By aligning the second fibres 108 normal to the planes of the first fibre sheets 104, electrical resistivity between the sheets is reduced. This in turn reduces electrical heating at otherwise high resistance contact nodes, thereby providing more uniform heating. Where the process is used to repair an existing component using a patch comprising the layers 104*a-e* of first fibres 102 and matrix 106 containing the second fibres 108, the process also reduces resistivity at the bond line between the patch and the original component, thereby reducing heating in this area. Consequently, the homogeneity of the heating is improved.

The process could comprise applying additional first fibres in the form of individual layers of dry, non-impregnated fibres (woven, unidirectional, 3D woven, etc.) to which matrix resin would be subsequently be applied in a form of a resin matrix transfer method such as RTM (Resin Transfer Moulding). In a further alternative, multiple sheets of first fibres could be applied to the component, which are pre-impregnated with matrix material (so-called "prepreg"). In a still further alternative, where the structural requirements permit, whole areas or regions of the component can be filled entirely with second fibre containing matrix and subsequent alignment of the second fibres in at least one orientation, possibly more, and is used to provide an electrical conduction path for heat curing and/or structural enhancement. The first fibres could be non-conducting, such as glass fibres.

In a repair scenario, the original material to be repaired need not be the same matrix as the new repairing matrix nor indeed does the original component need to be composite.

Consequently, the invention provides an effective repair method for repairing fibre composite components, and an effective method of forming original composite components. Due to the high quality of the cure and limited heating damage caused to surrounding areas, the method can be used to perform structural repairs of composite components, since the repair area can be expected to have a structural integrity close to that of the parent component. Furthermore, the described technique can in many cases be carried in situ, without first removing the component. The technique is also leads to low cure times.

It will be understood that the invention is not limited to the embodiments above-described and various modifications and improvements can be made without departing from the concepts described herein. Except where mutually exclusive, any of the features may be employed separately or in combination with any other features and the disclosure extends to and includes all combinations and sub-combinations of one or more features described herein.

For example, the technique could use different energy fields to align the fibres. Either the first or second fibres could comprise different materials. Where the process is used in a repair process, the component to be repaired could be a composite component itself, or could be a non-composite component. where the component to be repaired is a composite component, the resin within the existing component need not be of the same composition as the resin of the repair patch.

The invention claimed is:

1. A method of forming a fibre composite component, the method comprising:
   providing a plurality of first fibres, the first fibres being arranged in a plurality of layers with an uncured heat curable resin matrix being provided therebetween, the resin matrix including a plurality of second electrically conductive fibres suspended between the plurality of layers, the second fibres having a length extending along a long axis, the second fibres having a shorter length than the first fibres;
   applying an energy field to the resin matrix to thereby align the second fibres such that: (i) the long axis of the second fibres is oriented in a direction normal to the plurality of layers of the first fibres, (ii) and the second fibres provide an electrically conductive path between adjacent layers of the first fibres to form an electrically conductive fibre network; and
   applying an electric current through the electrically conductive fibre network to thereby heat and cure the resin matrix, wherein
   the fibre composite component has a plurality of first regions and a plurality of second regions, the plurality of first regions having second fibres that are unaligned, and the plurality of second regions having second fibres that are aligned by the energy field.

2. The method according to claim 1, wherein the plurality of layers of first fibres and the resin matrix are provided as a patch, and the method comprises applying the patch to a further component to be repaired prior to applying the fibre alignment and electrical heating steps.

3. The method according to claim 1, wherein the second fibres comprise one or more of carbon nano-tubes, graphene ribbons, carbon discs, carbon platelets, carbon rods, metallic fibres, and metallic flakes.

4. The method according to claim 1, wherein the method further comprises applying a ferrous coating to the second fibres.

5. The method according to claim 4, wherein the ferrous coating is applied by chemical vapour deposition.

6. The method according to claim 4, wherein the ferrous coating comprises one or both of Ni and COOH.

7. The method according to claim 1, wherein the second fibres comprise a length of between 1 nm and 100 μm.

8. The method according to claim 1, wherein the second fibres comprise a diameter of between 1 nm and 200 nm.

9. The method according to claim 1, wherein the energy field comprises one or more of an AC magnetic field, a unidirectional magnetic field, a DC electric field, and an acoustic wave.

10. The method according to claim 1, wherein the current in the electrically conductive fibre network is induced by one or both of eddy currents induced from an external AC or DC magnetic field and direct current applied directly to the part via conducting electrodes.

11. The method according to claim 1, wherein the resin comprises an uncured heat curable liquid, a gel epoxy resin, or a thermoset resin including one or more of Hexcel™ M56, M91, M21, or 8552, Prime 20LV and EPON 828.

12. The method according to claim 1, wherein the second fibres have an aspect ratio of approximately 10.

* * * * *